(12) United States Patent
Taylor

(10) Patent No.: US 8,636,019 B2
(45) Date of Patent: Jan. 28, 2014

(54) IN-SITU REMOVAL OF SEMICONDUCTOR PROCESS RESIDUES FROM DRY PUMP SURFACES

(75) Inventor: Anthony Park Taylor, Boston, MA (US)

(73) Assignee: Edwards Vacuum, Inc., Wilmington, MA (US)

( * ) Notice: Subject to any disclaimer, the term of this patent is extended or adjusted under 35 U.S.C. 154(b) by 1059 days.

(21) Appl. No.: 12/148,706

(22) Filed: Apr. 22, 2008

(65) Prior Publication Data

US 2008/0264453 A1    Oct. 30, 2008

Related U.S. Application Data

(60) Provisional application No. 60/926,164, filed on Apr. 25, 2007.

(51) Int. Cl.
*B08B 3/00* (2006.01)

(52) U.S. Cl.
USPC ........................................ 134/198; 134/166 R

(58) Field of Classification Search
None
See application file for complete search history.

(56) References Cited

U.S. PATENT DOCUMENTS

| | | |
|---|---|---|
| 5,158,644 A | 10/1992 | Cheung et al. |
| 5,443,644 A | 8/1995 | Ozawa |
| 5,609,721 A | 3/1997 | Tsukune et al. |
| 5,785,796 A | 7/1998 | Lee |
| 5,814,562 A | 9/1998 | Green et al. |
| 6,090,222 A | 7/2000 | Ivey et al. |
| 6,147,006 A | 11/2000 | Mouri et al. |
| 6,148,832 A | 11/2000 | Gilmer et al. |
| 6,255,222 B1 | 7/2001 | Xia et al. |
| 6,620,256 B1 | 9/2003 | Arno et al. |
| 2007/0065578 A1 | 3/2007 | McDougall |

FOREIGN PATENT DOCUMENTS

WO    WO 2004/036047 A1    4/2004

OTHER PUBLICATIONS

PCT Notification of Transmittal of the International Search Report and the Written Opinion of the International Searching Authority, or the Declaration of International Application No. PCT/US 08/05217; Date of mailing: Aug. 22, 2008.
PCT International Search Report of International Application No. PCT/US 08/05217; Date of mailing of the International Search Report: Aug. 22, 2008.
PCT Written Opinion of the International Searching Authority of International Application No. PCT/US 08/05217; Date of mailing: Aug. 22, 2008.

*Primary Examiner* — Eric Golightly
(74) *Attorney, Agent, or Firm* — Shumaker & Sieffert, P.A.

(57) ABSTRACT

The present invention relates to vacuum processing systems in which process gases are introduced in a process chamber and are exhausted through a vacuum processing system exhaust path. Deposits made by the exhausted gases in one or more dry vacuum pumps are removed by introducing hydrofluoric acid upstream of the dry pump while the processing chamber is idle. The hydrofluoric acid is introduced upstream of the dry pump through a nozzle in the foreline or at the inlet to the dry pump.

12 Claims, 7 Drawing Sheets

IN-SITU REMOVAL OF SEMICONDUCTOR PROCESS RESIDUES FROM DRY PUMP SURFACES

CROSS REFERENCE TO RELATED APPLICATIONS

This application claims the benefit of U.S. Provisional Patent Application Ser. No. 60/926,164 entitled "In-Situ Removal of Semiconductor Process Residues from Dry Pump Surfaces" filed on Apr. 25, 2007, the contents of which are hereby incorporated by reference in its entirety.

FIELD OF THE INVENTION

The present invention relates generally to the field of vacuum deposition processing using process gases, and more particularly, to removing a buildup of deposits from the process gases on inner surfaces of dry vacuum pumps used in a vacuum processing system.

DETAILED DESCRIPTION OF THE INVENTION

The present invention addresses the problem of removing process residue coatings adhering to a dry pump mechanism in a semiconductor manufacturing process. The method and apparatus of the invention are especially applicable to processes where TDMA metal precursors or TEMA metal precursors are used in the process chamber, resulting in adherent coatings with significant organic content being formed in the dry pump mechanism. The invention, however, is not limited to use with those processes, and may be used in processes where other metal organic precursors result in similar adherent coatings with significant organic content. The inventor has developed an apparatus and process whereby those coatings are removed by injecting a dilute hydrofluoric acid into the inlet of the dry pump when the semiconductor process chamber is idle.

Figure 2:
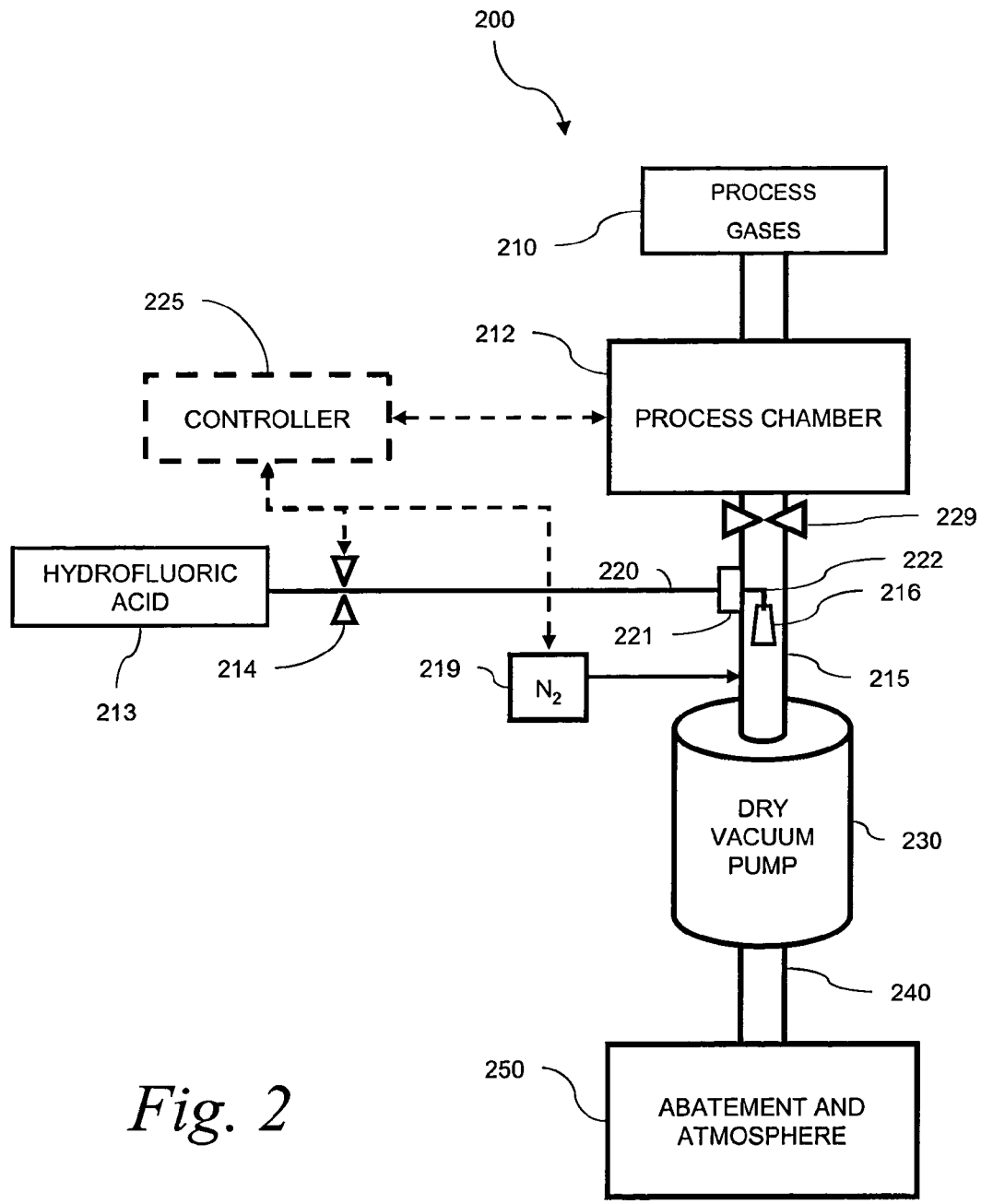
FIG. 2 is a schematic representation of a system according to one embodiment of the invention.

A system 200 according to the invention is shown in FIG. 2. Process gases 210 are introduced into a process chamber 212 under vacuum. Semiconductor manufacturing processes use precursor gases such as metal organic precursors and oxidizers to deposit metal oxides on a substrate. Two such processes are atomic layer deposition (ALD) and chemical vapor deposition (CVD). For example, hafnium oxide ALD films are deposited on wafers using Tetrakis dimethylamino hafnium (TDMAH) and ozone, or using Tetrakis ethylmethylamino hafnium (TEMAH) and ozone. Metalorganic ALD processes such as those create, by their nature, organic waste products from partially decomposed ligands that form the metallic precursors used in the processes. The ALD deposition process is generally a two step process, wherein the metal organic precursor is first flowed through the chamber in an initial gas pulse, depositing a thin metal layer, followed by purging and then flowing ozone through the chamber in a second pulse, forming the metal oxide. Gas phase reactions occur downstream of the chamber, and the secondary reaction products condense in the dry pump. Those organic waste products quickly build up deposits on the working surfaces of the vacuum pump.

In the case of ALD processes used in the deposition of hafnium oxide, it is believed that those waste products include an amorphous organic matrix containing hafnium oxide grains. The hafnium oxide grains are relatively hard, resulting in a very abrasive composite.

Figure 1:
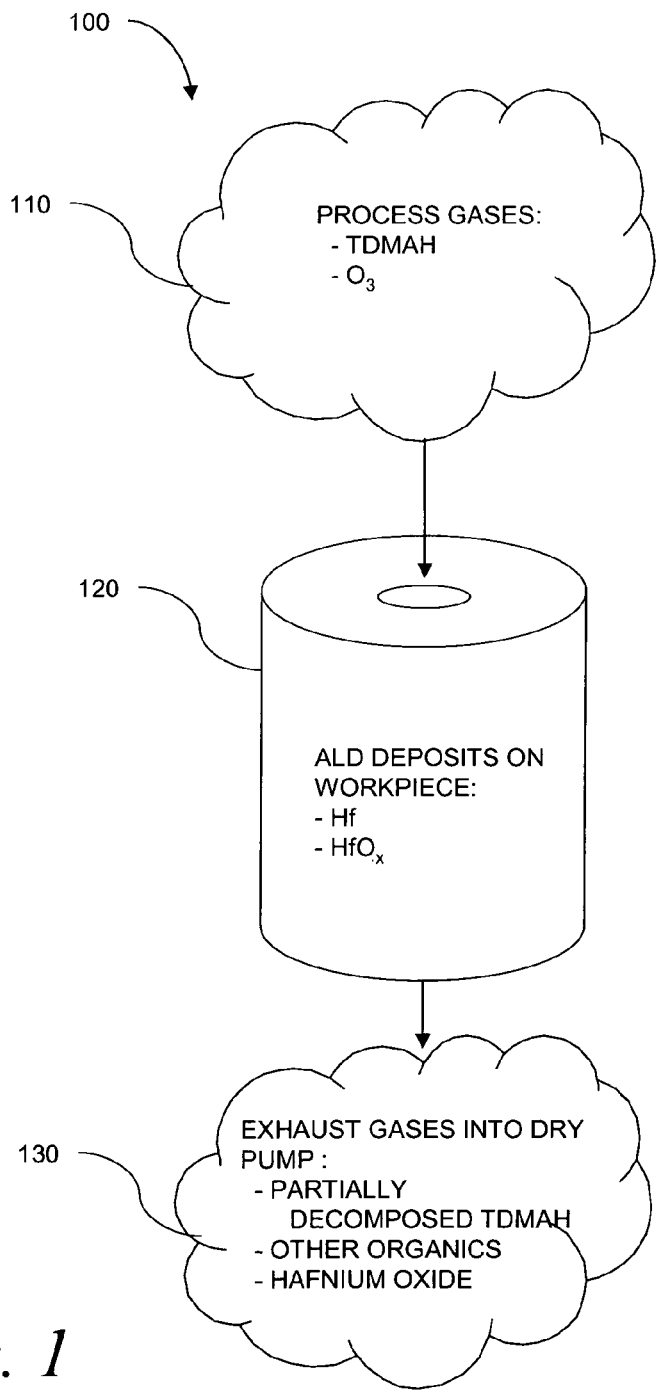
FIG. 1 is a graphical representation of a vacuum semiconductor manufacturing process.

An exemplary vacuum deposition process 100 is shown schematically in FIG. 1. In that process, hafnium oxide films are deposited on a substrate in an ALD process by introducing the process gases 110, Tetrakis dimethylamino hafnium (TDMAH) and ozone, into the process chamber. In the process chamber 120, the ALD process produces a self-limiting, sequential surface chemistry that deposits conformal thin-films of materials onto substrates that may have varying compositions. Because the hafnium metal is provided as a metalorganic precursor, exhaust gases 130 from the process contain various organic and metallic byproducts in vapor and solid form. Those byproducts may be deposited on functional surfaces of the dry pump as they pass through that mechanism.

Figure 7:
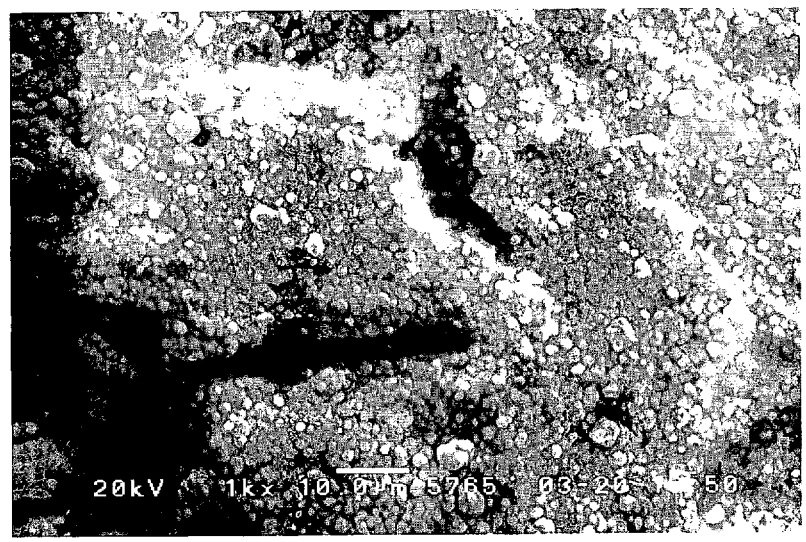
FIG. 7 is an electron micrograph showing deposits on a dry pump working surface.

The photomicrograph shown in FIG. 7 depicts an enlarged portion of a deposit on a functional surface of a dry pump. The figure clearly shows that the deposit has a nodular nature, with the largest nodules exceeding 5 microns in diameter. The nodular nature of the deposit suggests that the deposit "grows" on seed nuclei either in the gas phase or on the pump surface or both. Additional testing has also suggested that the deposits are largely organic in nature.

Powders formed by gas phase nucleation may accumulate on surfaces of the dry pump. Gas phase nucleation results from reactions among gas phase components of the exhaust gas, resulting in a solid reaction product in powder form. That product may accumulate on surfaces with which it comes in contact. As used herein, the term "deposit" shall mean solids accumulating on surfaces in the exhaust path due to any physical mechanism, including film deposition, gas phase nucleation or other phenomena.

However they are formed, the deposits adversely affect the performance of the dry vacuum pump and other devices in the vacuum processing system exhaust path. For example, deposits on the pumping elements of dry vacuum pumps change the effective shape of the pumping elements, degrading the efficiency and effectiveness of the pump. The deposits can also cause premature wear and failure.

Returning to FIG. 2, a vacuum exhaust path of the system includes a foreline 215 connecting the process chamber 212 with a dry vacuum pump 230. "Dry" vacuum pumps greatly reduce or eliminate oil contamination and the need for fluids, traps and filters, all of which are characteristics of oil-sealed rotary vacuum pumps. Recent improvements in compression ratios, pump life, initial cost, and noise have made dry pumps more attractive in many applications. Dry pumps now offer a lower cost of ownership because there is lower maintenance, no used oil to dispose of, no filters or oil to change, and no oil residue to clean up.

In addition to vacuum deposition processes, dry pumps are also well suited for loadlock chambers, transfer chambers, metrology tools (e.g., wafer inspection tools, mass spectrometers, electron microscopes), and as forepumps for high-vacuum process chambers. Dry vacuum pumps typically operate with inlet pressures of $10^{-2}$ Torr to 100 Torr and exhaust to atmospheric or nearly atmospheric pressure.

Reliable dry vacuum pumps with low cost of ownership and maintenance requirements are frequently used in chemical vapor deposition (CVD) and atomic layer deposition (ALD) processes, where contamination must be held to a minimum. For example, dry vacuum pumps are used in the deposition of hafnium oxide ALD films using Tetrakis dimethylamino hafnium (TDMAH) and ozone, and are used in the deposition of hafnium oxide ALD films using Tetrakis ethylmethylamino hafnium (TEMAH) and ozone.

Several dry vacuum pump configurations are available for producing and maintaining a high vacuum. Roots vacuum pumps and hook and claw vacuum pumps include two precisely machined rotors that rotate with equal speed in opposite directions, trapping gas in an exhaust portion of the casing and forcing it to an exhaust port. Roots and hook and claw vacuum pumps are used as primary vacuum pumps and as backing pumps. Other classes of dry vacuum pumps include scroll pumps, in which gas in a helical path is advanced through the pump by an orbiting rotor, and screw pumps, wherein one or more helical rotors are rotated to advance gas through the pump.

While oil-sealed pumps improve seal effectiveness with oil, oil is not available to seal the chamber of a dry vacuum pump. Instead, dry pump designs rely on maintaining relatively small clearances between moving components. That characteristic of dry pumps makes them more susceptible to the deposition of adherent process waste products, which can cause rapid wear and even premature catastrophic failure.

A dry pump inlet may communicate directly with the process chamber or may communicate with a process chamber 212 through a foreline 215 as shown in FIG. 2. The foreline may, for example, be a pipe from 1.5 inches to 6 inches in diameter, and up to about 60 feet long. A vacuum processing system exhaust path normally includes an abatement system for reclaiming, removing or neutralizing various components of the exhaust.

In the furnace applications used in ALD processing, the foreline is about 6 inches in diameter, and may be from 5 to 60 feet long. A foreline shutoff valve 229 is capable of sealing the vacuum process chamber 212 from the foreline 215 during the pump cleaning process described below.

A source 213 of hydrofluoric acid provides liquid acid through a hydrofluoric acid supply line 220 to the foreline 215. A valve 214 or liquid flow controller controls the flow of hydrofluoric acid into the foreline.

In the preferred embodiment shown, the supply line 220 terminates in a nozzle 216 oriented in a direction parallel with flow in the foreline 215. The nozzle includes an orifice having a diameter in the range of about 100 microns to 1000 microns. In a currently preferred embodiment, the nozzle orifice is 225 microns in diameter. The valve or liquid flow controller 214 may be external from the nozzle 216, as shown in FIG. 2, or the valve and nozzle may be integral.

Dilute liquid hydrofluoric acid emerging from the nozzle 216 impinges directly on the hot surfaces of the dry vacuum pump 230 and vaporizes. The vaporized hydrofluoric acid dissolves or otherwise interacts or reacts with organic and other deposits on the inner surfaces of the dry vacuum pump to remove those deposits. The removed deposits are exhausted through abatement equipment 250 to atmosphere.

The inventor has found that dilute aqueous hydrochloric acid is particularly effective in removing the nodular deposits formed in the dry pump during an ALD process. It is believed that the considerable surface area of the deposit, shown in the electron micrograph of FIG. 7, makes it susceptible to certain etchants.

The aqueous hydrofluoric acid used in the present invention is considerably lower in cost than other sources of ionic fluorine. Further, the cost of the equipment used in the present invention to deliver the hydrofluoric acid to the dry pump is considerably less than the cost of equipment used in delivering alternative fluorine ion sources, such as equipment used in creating a plasma.

To direct the nozzle 216 in a direction parallel with the foreline 215, and thereby entrain the liquid on hot surfaces of the dry pump, the line 220 may have a 90° bend 222 as shown in FIG. 2. A removable flange or spool piece 221 stabilizes the line 220 with respect to the foreline 215, and provides a vacuum seal such as an O-ring seal. In a preferred embodiment, the flange is removable from a port in the foreline. The port can be sealed for operation without the hydrofluoric acid supply line and nozzle.

The use of the pump inlet for introducing the aqueous hydrofluoric acid eliminates the need for a specially constructed pump having ports in the pump housing for delivering the fluid. The inventor has discovered that the internal components of the pump are thoroughly cleaned by injecting hydrofluoric acid into the foreline upstream of the pump or injected directly into the pump inlet.

To prevent ice crystals from forming in the rapidly expanding stream of liquid hydrofluoric acid from the nozzle 216, nitrogen from a nitrogen source 219 may be injected in the foreline 215 upstream or downstream of the nozzle 216 to increase pressure. For example, in a foreline having a process operating pressure of approximately 0.005 Torr, nitrogen may be injected, increasing the pressure to between 0.1 and 50 Torr, and preferably to about 40 Torr. Injection of the hydrofluoric acid may additionally raise the pressure to, for example, about 44 Torr.

The dry vacuum pump may have an overload protection system that decreases pump speed upon sensing an increased load or increased pressure. The overload protection system may sense the increased pressure resulting from the injection of nitrogen and hydrofluoric acid, and may substantially decrease the pump speed, further increasing pressure in the pump and foreline to 100 Torr, and possibly up to 400 Torr. In that case, the cleaning takes place at a low pump speed and increased pressure.

In an alternative embodiment, the mass flow rate of vaporized hydrofluoric acid is adjusted so that the inlet pressure to the dry vacuum pump is in the range from 0.1 Torr to 50 Torr during operation.

Figure 3:
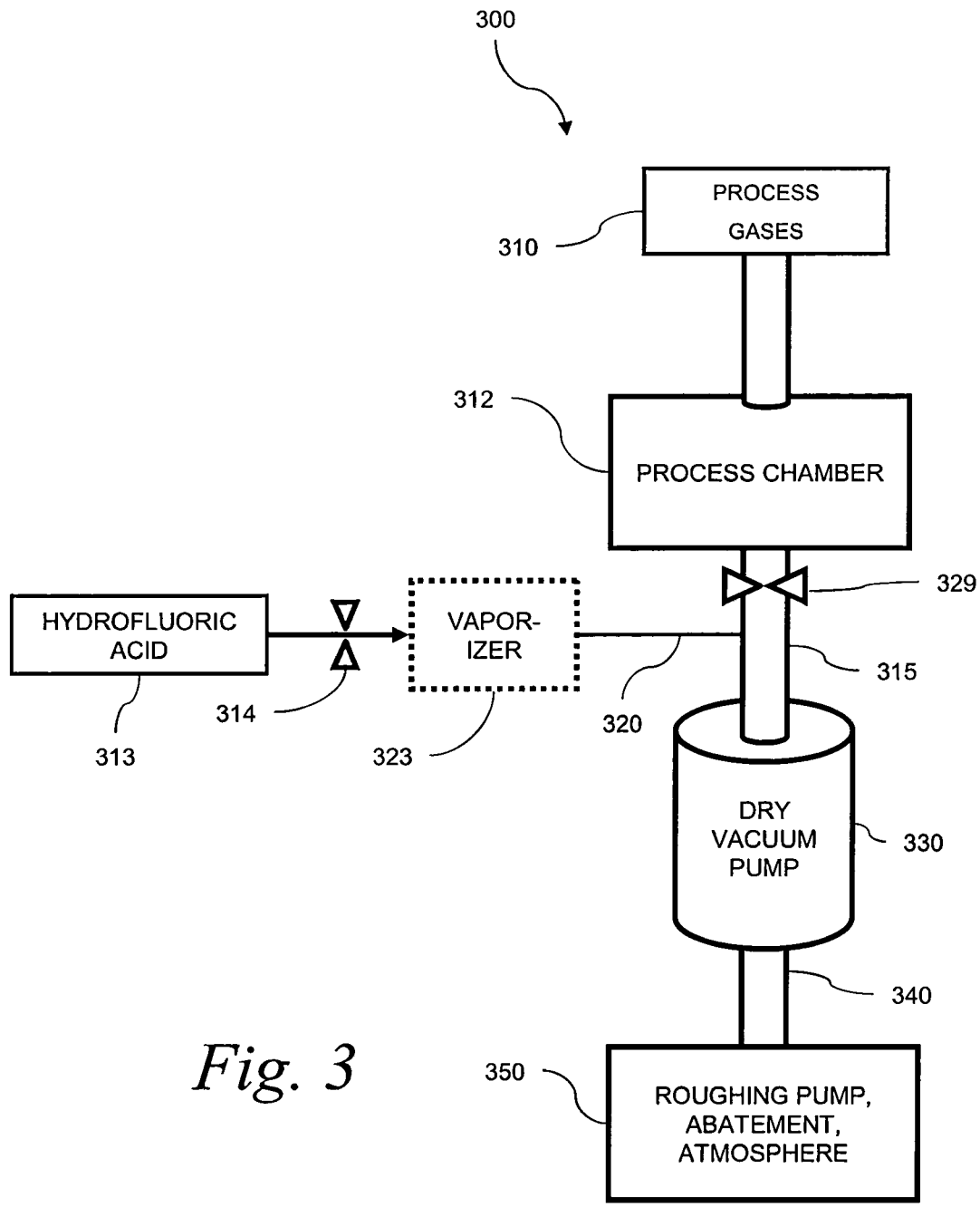
FIG. 3 is a schematic representation of a system according to another embodiment of the invention.

In another embodiment of the invention, ice formation in the acid stream is minimized by vaporizing the liquid before it enters the nozzle. FIG. 3 shows a system according to that embodiment, with corresponding elements from FIG. 2 having element numbers incremented by 100. A vaporizer 323 is placed in the supply line 320 to vaporize the hydrofluoric acid from the supply 313 before it enters the foreline 315. The hydrofluoric acid is preferably vaporized using a heating element (not shown) in the vaporizer 323. The vaporized hydrofluoric acid may be introduced into the foreline through a nozzle or simple orifice (not shown) or other means.

Alternatively, the liquid hydrofluoric acid may be atomized by the nozzle itself when it is introduced into the foreline.

Figure 4:
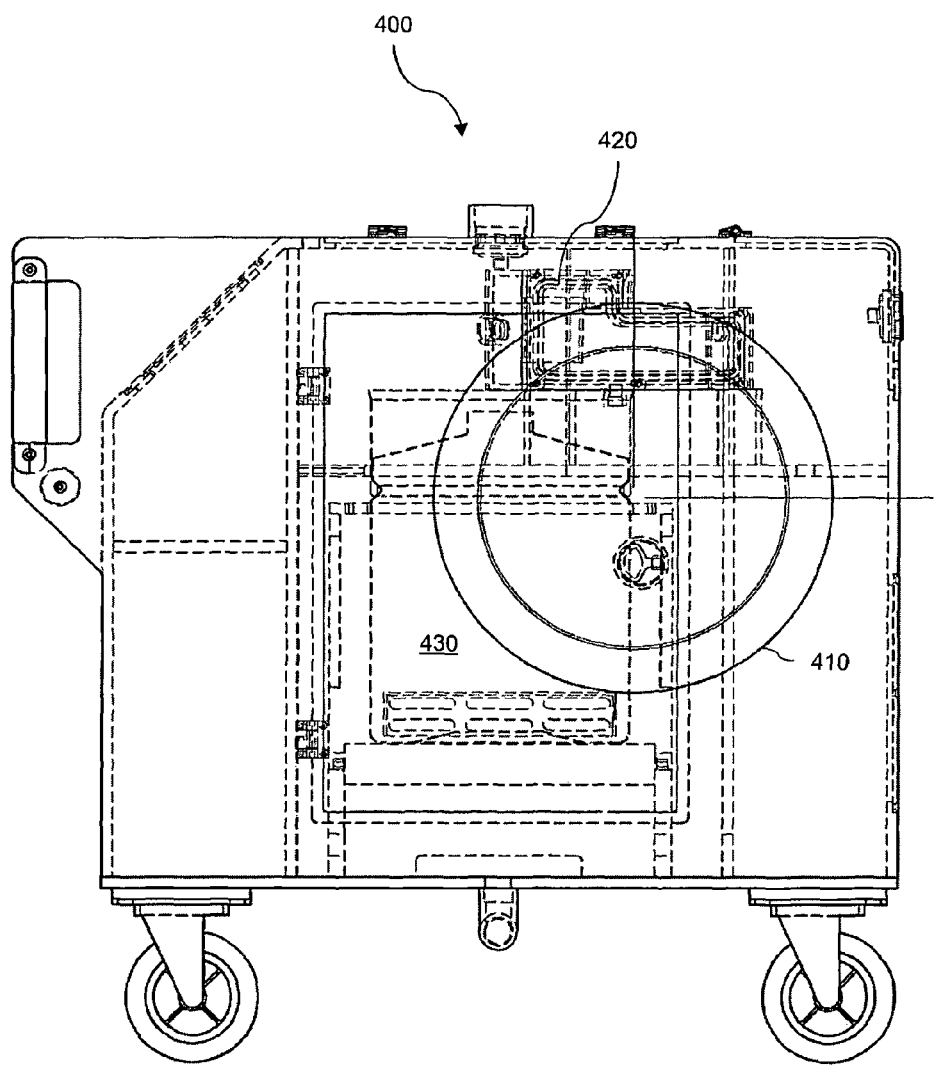
FIG. 4 is a front elevation view of an apparatus used in practicing one embodiment of the invention.

A mobile cart 400, shown in FIG. 4, may be used to manually or automatically implement the methods of the invention. The cart is preferably a Smartcart™ High Purity Chemical Transfer System available from Edwards Chemical Management Division of Chanhassen, Minn. The cart 400 includes a container 430 of hydrofluoric acid. The acid may be at the concentration to be used in the process, which is about 0.1% to 20% by volume. Alternatively, the acid in the container 430 may be at a higher concentration as available commercially. In that case, water is added to the hydrofluoric acid to dilute the acid to the proper concentration for use in the present method. The container 430 may be a NowPAK® chemical supply container available from ATMI Packaging, Inc. of Minneapolis, Minn.

Figure 5:
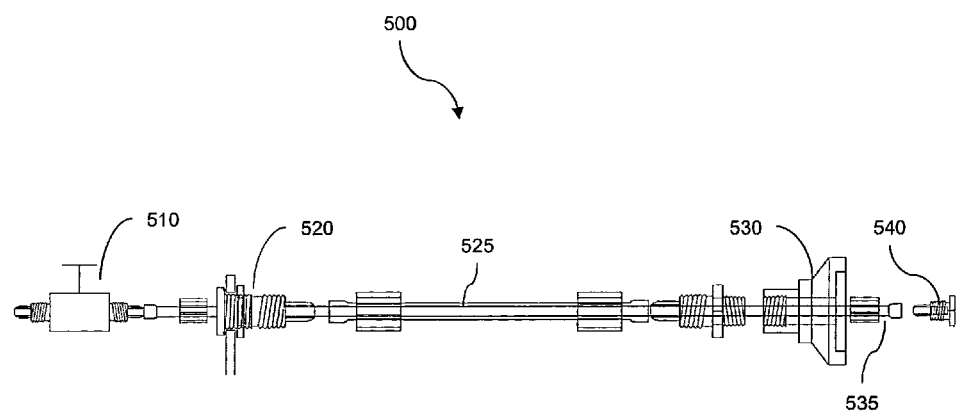
FIG. 5 is schematic diagram of a coupling according to one embodiment of the invention.

The cart 400 also includes a valve box 420 for controlling the flow of hydrofluoric acid. Connected to the valve box is a coupling 500, shown in detail in FIG. 5. A valve 510 in the valve box is connected to a double containment fitting 520, double containment tubing 525, a sealing flange 530 including an O-ring (not shown) for connecting to and sealing with the foreline, and a nozzle 540. A 90° bend (not shown) in the tubing at point 535 may direct the nozzle 540 in a direction perpendicular to the flange to orient the nozzle as shown in FIG. 2, parallel with the foreline.

The double containment tubing 525 may be flexible and may be stored on a spool 430 when not in use. The cart 400 may be moved from tool to tool throughout a manufacturing facility to perform the method of the invention on a plurality of dry pumps.

Figure 6:
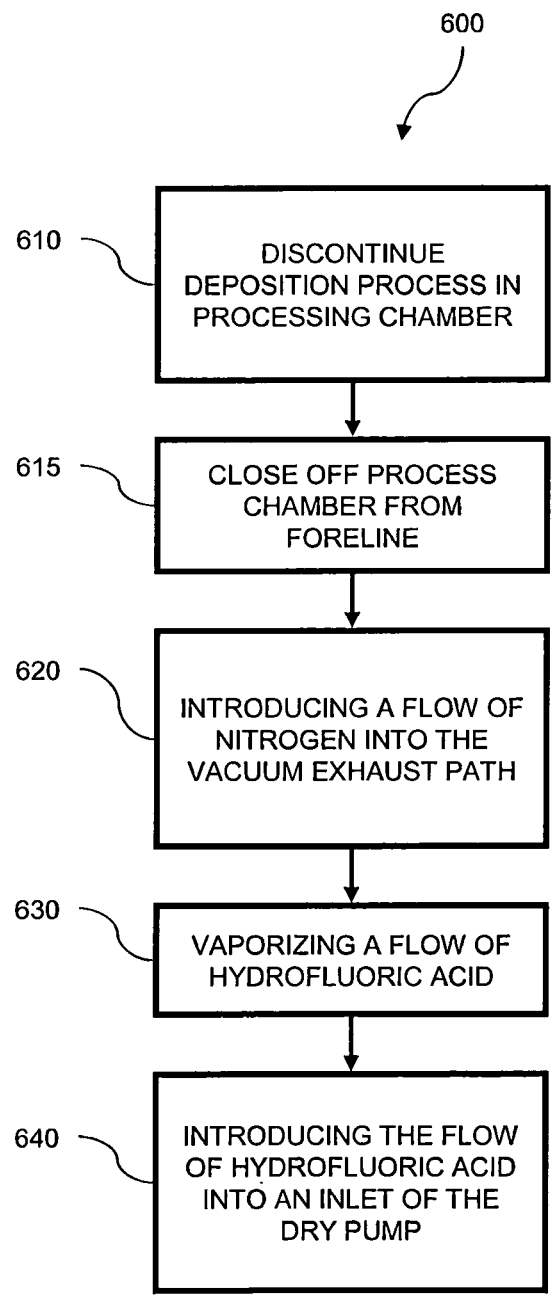
FIG. 6 is a flow chart depicting a method according to one embodiment of the invention.

A controller 225 (FIG. 2) may be incorporated in the present invention to properly sequence events in the process. The controller 225 communicates with the process chamber 212 or with a separate process chamber controller (not shown). The controller may also communicate with the valve 214 and with the nitrogen supply 219. The controller 225 has access to computer-readable media containing instructions that, when executed, perform a series of steps as shown in the method 600 of FIG. 6. The controller ascertains that the processing chamber is idle or that processing in the chamber has terminated (step 610) before initiating the dry pump cleaning steps. The foreline shutoff valve 229 may then be closed (step 615) to prevent the hydrofluoric acid from contaminating the process chamber. A flow of nitrogen may then be introduced (step 620) into the foreline. In one embodiment, the flow of hydrofluoric acid is vaporized (step 630) before it enters the nozzle. The flow of hydrofluoric acid is then introduced (step 640) into the inlet of the dry pump by opening the valve 214 (FIG. 2).

The hydrofluoric acid source 213, the valve 214, the supply line 220 and other associated equipment shown in FIG. 2 may be used in a facility having multiple process chambers, forelines and dry vacuum pumps. The hydrofluoric acid source may be a central, permanently mounted device in the facility, having supply lines running to each of a number of forelines. That configuration permits the relatively low-cost supply of hydrofluoric acid to a plurality of tools using a single source of acid. A central controller similar to the controller 225 may control the cleaning cycles for each of the dry pumps, operating valves similar to the valve 214 for each supply line.

The foregoing Detailed Description and accompanying figures are to be understood as being in every respect illustrative and exemplary, but not restrictive, and the scope of the invention disclosed herein is not to be determined from the Description of the Invention, but rather from the Claims as interpreted according to the full breadth permitted by the patent laws. For example, while the system is described in connection with removing deposits of the organic and metalorganic byproducts of ALD and CVD processes from vacuum dry pumps, the system may similarly be used to remove similar by products created in other processes. It is to be understood that the embodiments shown and described herein are only illustrative of the principles of the present invention and that various modifications may be implemented by those skilled in the art without departing from the scope and spirit of the invention.

What is claimed is:

1. A system for removing process residues from a dry vacuum pump having an inlet connected to a processing chamber through a foreline, the system comprising:
    an injection nozzle positioned for introducing a fluid into the inlet of the dry vacuum pump;
    a source of aqueous hydrofluoric acid connected to the injection nozzle to supply aqueous hydrofluoric acid directly to the foreline via the injection nozzle, without passing through an intervening vaporizer disposed between the source of aqueous hydrogen acid and the foreline; and
    a valve positioned between the source of aqueous hydrofluoric acid and the injection nozzle for regulating a flow of the aqueous hydrofluoric acid through the injection nozzle.

2. The system of claim 1, further comprising:
    a controller for controlling at least the valve and the processing chamber, the controller opening the valve only when the processing chamber is idle.

3. The system of claim 1, wherein the injection nozzle is oriented to direct a spray toward the dry vacuum pump.

4. The system of claim 1, wherein the injection nozzle is oriented to direct a spray along a longitudinal axis of the foreline.

5. The system of claim 1, wherein the source of aqueous hydrofluoric acid supplies acid that is dilute in the range of 0.1% to 20% by volume.

6. The system of claim 1, further comprising:
    a neutral gas source connected for introducing a neutral gas into the foreline.

7. The system of claim 6, wherein the neutral gas source is a nitrogen source.

8. The system of claim 6, wherein the dry pump further comprises an overload control system, and wherein introduction of the neutral gas and the aqueous hydrofluoric acid causes the overload control system to reduce a speed of the dry pump.

9. The system of claim 1, wherein the injection nozzle is positioned in the foreline at a point upstream of the inlet of the dry vacuum pump.

10. The system of claim 1, wherein the injection nozzle is positioned at the inlet of the dry vacuum pump.

11. The system of claim 1, wherein the source of aqueous hydrofluoric acid is connected to a plurality of injection nozzles for introducing fluid into a plurality of dry vacuum pumps.

12. The system of claim 1, further comprising:
    a port in the foreline; and
    a flange supporting the nozzle, the flange being removeably connected to the port.

* * * * *